United States Patent [19]

Baldwin

[11] 4,306,313
[45] Dec. 15, 1981

[54] HIGH RELIABILITY OPTICAL FIBER COMMUNICATION SYSTEM

[75] Inventor: David L. Baldwin, Roanoke, Va.

[73] Assignee: International Telephone and Telegraph Corporation, New York, N.Y.

[21] Appl. No.: 83,743

[22] Filed: Oct. 11, 1979

[51] Int. Cl.³ .................................. H04B 9/00
[52] U.S. Cl. ..................... 455/601; 179/175.35; 179/175.3 F; 455/8; 455/612
[58] Field of Search .............. 455/8, 601, 606, 610, 455/612; 375/3; 371/8; 370/16; 179/175.3 S, 175.3 F

[56] References Cited

U.S. PATENT DOCUMENTS

| | | | |
|---|---|---|---|
| 3,859,468 | 1/1975 | Smith et al. | 370/16 |
| 4,030,069 | 6/1977 | Henrickson et al. | 455/8 |
| 4,166,946 | 9/1979 | Chown et al. | 455/601 |

OTHER PUBLICATIONS

Milton–Optical Fiber Applications–Conf. Agard Lecture Series No. 76 on E–O Systems–London Eng., 19–20 May 1975, pp. 8-1 to 8-21.

Primary Examiner—Joseph A. Orsino, Jr.
Attorney, Agent, or Firm—John T. O'Halloran; Peter C. Van Der Sluys

[57] ABSTRACT

There is disclosed an optical transmission system which employs a plurality of receiver-transmitter pairs. One of the plurality of pairs is selected to propagate optical signals under control of switching means. The optical signal as propagated is monitored and if a fault is detected in the signal, another redundant receiver-transmitter pair is automatically switched in. This pair is also monitored to determine whether or not the optical signal is valid and if not, the sequence continues until a valid signal is being propagated.

10 Claims, 2 Drawing Figures

HIGH RELIABILITY OPTICAL FIBER COMMUNICATION SYSTEM

BACKGROUND OF THE INVENTION

This invention relates to communications systems in general and more particularly to a communication system employing optical fibers as transmission elements.

Extreme advances have been made in the development of fiber optic communication systems. At the present state of technology, there are a great number of commercial applications of such systems and it has been indicated that fiber optics will be extensively employed in regard to communications systems such as telephone, data processing and so on.

The fiber optic has extreme advantages over twisted pair wire systems and coaxial cable systems. With the advances made in technology, industry anticipates that graded-index fibers with under 5 db loss and operating at bandwidths greater than 500 MHz will be relatively inexpensive and will be completely compatible with the costs of cable copper wire. In general, the optical fiber is expected to be economically superior to wire or cable communications as the fiber offers large bandwidths, small size and decreased weight. It is further known that optical fiber cable is easier to install and generally easier to assemble.

In any event, there is a great need in any communication system to achieve high reliability and thus to achieve optimum operation for both undersea and overland transmission of information. Coaxial cable systems as presently used are associated with high reliability. To achieve high reliability in coaxial systems, the number of repeaters and the number of active parts in each repeater are minimized. Also, each part used is specially developed, selected and tested to demanding specifications. Such procedures have developed in the coaxial cable art over an extensive period and present techniques are still time consuming and expensive. For optical fiber systems, reducing the number of parts in a transmission system is even more difficult due to the required high gain and complexity. One reason that optical fiber repeaters may be more complex than their coaxial counterparts is that conventional fault location techniques will not operate in an optical fiber system. In coaxial systems including telephone transmission systems, the art of fault location is relatively sophisticated but such approaches have no applicability and hence, cannot be employed with optical fibers.

It is therefore an object of the present invention to provide an improved transmission or communication system employing optical fibers. The transmission system employs redundant elements for achieving automatic fault control and high reliability. Based on the use of redundant optical components, one can achieve large improvements in reliability while using relatively conventional components, as well as fault location.

DESCRIPTION OF THE PREFERRED EMBODIMENT

An optical transmission system comprising input coupling means for receiving an optical signal at an input terminal and for propagating said signal to a plurality of output terminals, a plurality of optical receiver-transmitter pairs, each having an input coupled to and associated with one of said output terminals, each of said receiver-transmitter pairs adapted to be selectively activated to respond to said optical signals upon selection, detector means coupled to said receiver transmitter pairs and operative to monitor the optical signal propagating therein to provide a control signal when said signal exhibits a deviation from predetermined standards, and switching means coupled to said plurality of optical receiver-transmitter pairs for selecting any desired one, said switching means responsive to said control signal to select one receiver-transmitter pair as compared to another when said signal exhibits said deviation.

BRIEF DESCRIPTION OF THE DRAWINGS

Above-mentioned and other features and objects of this invention will become more apparent by reference to the following description taken in conjunction with the accompanying drawings, in which.

DETAILED DESCRIPTION OF THE INVENTION

Figure 1:
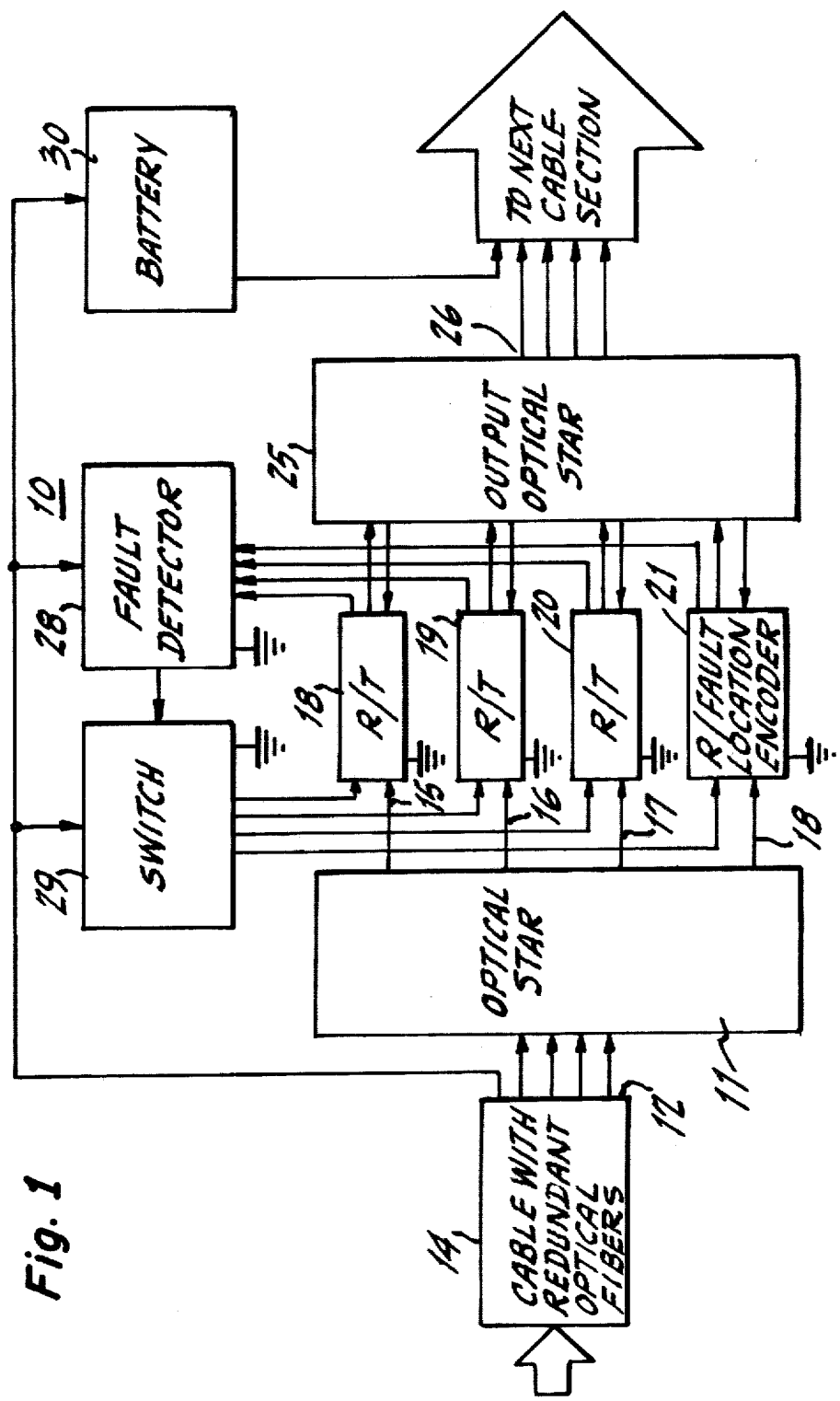
FIG. 1 is a block diagram of an optical transmission system according to this invention.

Referring to FIG. 1, a block diagram of a typical transmission system employing optical fibers is depicted. As shown in FIG. 1, each cable section is associated with a repeater generally designated as 10. Each repeater section consists of an input optical star 11.

The optical star is a well known component in the optical field and basically is used in multi-terminal fiber optic communication systems to direct light signals to various outputs. The optical star is a radial arm coupler and essentially permits one to couple an input cable to a series of output terminals. Since the optical star is a parallel system, the optical power is relatively independent of the pair of system terminals being considered. Such star couplers can handle in excess of ten remote terminals without consuming an undesirable portion of the available optical power. For a description of some of the advantages of the optical star, reference is made to an article entitled "Optical Communications" published in "Electronics", a McGraw-Hill publication, Aug. 5, 1976, pages 102–104.

The optical star 11 has a series of input terminals 12 which emanate from an input cable section 14 having a repeater section which is similar to the repeater section shown herein. The optical star 11 has a plurality of output ports 15,16 and 17. Each output port is coupled to an output fiber and is employed as an input to a receiver and transmitter pair (R/T). In the FIG. shown, there are three R/T pairs although other numbers of R/T pairs can be employed. Fiber 15 is coupled to R/T pair 18, fiber 16 to R/T 19 and fiber 17 to R/T 20. Also shown is a fourth fiber 18 coupled to an output of the optical star 11, which fiber is directed to an input of fault location encoder 21.

The output of each R/T pair 18, 19 and 20 are coupled to the inputs of an output optical star 25. There are shown two lines coupling the outputs of each R/T pair 18, 19, 20 and 21 to the input of the optical star 25 to denote bi-directional transmission. The output of the optical star 25 is obtained via output ports 26 and is directed to the next cable section.

As seen from FIG. 1, an output of each R/T pair 18-20 is directed to inputs of a fault detector 28. The output of the fault detector 28 is coupled to an input of a switch circuit 29. The switch circuit 29 has multiple outputs, each of which is coupled to one of the R/T pairs 18,19 and 20. One switch output is also coupled to an input of the fault location encoder 21.

A battery 30 is shown. The battery operates to energize the fault detector 28 and the DC switch 29. The battery may be an electrical power conductor which is contained in the optical cable as is well known in the art and provides a source of potential which is coupled through switch 29 to enable, as will be described, the activation of the R/T units 18-20.

The switch 29 is a DC power switch which operates to furnish potential to any one of a selected R/T pair. The switch 29 is controlled in operation by the fault detector 28 and hence, upon detection of a fault, as will be explained, the switch is operated to select an alternate R/T pair.

Basically, the system shown in FIG. 1 operates as follows: Any selected one of the R/T pairs 18-20 is energized by means of switch 29. The output of the selected R/T pair is monitored by the fault detector 28. For example, the fault detector 28 may comprise an average detector circuit which essentially, responds to the average value of the output signal emanating from an R/T module. If the average value falls below a predetermined level, the fault detector provides a signal which activates the switch 29. In this manner, the switch 29 functions to select another R/T pair whose output is again monitored by the fault detector.

The fault detector 28 consists of a photodetector device which can, for example, be a photodiode. The output of the photodiode is coupled to the input of a rectifying circuit to produce a DC signal indicative of the magnitude of the optical signals transmitted by an R/T unit. If the average value of the signal falls below a predetermined level, the fault detector provides an output control signal which causes the switch 20 to remove bias from the faulty unit and apply operating potential to the next unit. This can be done in a sequential manner as, for example, R/T 18 can be selected first, then R/T 19 and so on.

Average detectors as well as circuits for providing an output signal when an optical signal falls below a predetermined level are well known in the art. Examples of such circuits include differential amplifiers employed as threshold devices, Schmitt triggers and other threshold detectors.

Each R/T module as 18 to 19 conventionally contains a receiver portion in the receive leg. A typical receiver requires a photodetector that responds strongly to the peak output wave length of the source and the spectral portion of the fiber. As such, the photodetector may be a p-i-n diode or a phototransistor or an avalanche photo diode APD. The APD combines optical signal detection with internal amplification of photo current.

Receiver circuits are quite well known and require a biasing voltage which is supplied by battery 30 via switch 29. Hence, upon removal of this voltage from the receiver portion of the R/T pair, the receiver will become disabled.

The transmitter section usually employs a laser diode or LED (light emitting diode) in a controlled circuit. The circuit functions to respond to the information on the transmitted signal to modulate the laser diode according to the light information contained in the signal. Many examples of suitable circuits are known in the art and such circuits are also biased by means of the battery 30 via the switch 29. Hence, upon operation of the switch 29, any one of the R/T pairs 18-20 can be turned on or off under control of the fault detector 10.

While the above discussion concentrated on a fault detector of the average value type, other techniques for detecting errors in an optical signal can be employed as well. For example, if the transmission system employs digital signals, the fault detector 28 can operate as a parity circuit and hence, detect whether or not each digital signal has a correct parity bit. If parity is not correct, then the fault detector can operate to activate switch 29 and hence, activate another R/T pair.

In the simplest form of the automatic fault control circuit shown in FIG. 1, each repeater 10 may contain one optical star as 25 as an output, two fibers and two R/T pairs as 18 and 19. Optical star 11 combines the optical power from either of the two R/T pairs and redistributes that power equally into the two optical fibers. Only one R/T pair as 18 in each repeater is activated at one time. The active R/T pair is selected by the DC electrical power switch 29. The optical signal power from 18 flows down both optical fibers and either fiber can deliver the signal to the next repeater via the output coupler 25. The output power from the activated R/T pair is monitored by the fault detector 28. If the power is proper, then the R/T pair 18 continues to operate. When the fault detector 28 senses an improver level, then the DC power is switched from the first to the second R/T pair. If after a short delay, the signal from the second pair is also improper, then the fault detector will switch DC power back to the first pair. Thus, as shown in FIG. 1, if there are several R/T pairs, then each would be tried in sequence. The sequence is repeated until one of the R/T pairs generates a proper signal.

In the above description, it is conceivable that all the redundant elements in the case of two R/T pairs will fail. Thus shown in FIG. 1 is a fault location encoder 21. The encoder 21 is activated in sequence by the switch 29 in the same manner as the R/T pairs 18-20. If the encoder receives a proper signal from the previous repeater via the optical star 11 at the time it is activated, then it simply causes the DC switch 29, via the fault detector 28, to transfer power back to the first R/T pair. If it is not receiving a proper signal when it is activated, then it transmits an identity code via the output optical star 25, which code goes to the next cable section indicating a fault has occurred. In this manner, the last functioning repeater section identifies itself thus accurately locating the fault.

Before proceeding to give a more detailed explanation of operation, it is understood that the above described system is particularly adaptable to increase the reliability of optical communication systems. The system can accommodate information which is present on an optical waveform in either an analog or digital format and hence, is applicable to audio, video or digital data of the type employed in computer communication systems. The optical repeater thus described lends itself to undersea or overland transmission of optical information and with the fault detecting, enables one to accurately locate a defective repeater section. The use of redundant components such as the R/T pairs eliminates a need for specifying extremely accurate circuitry as the redundancy inherent in the system will assure optimum operation by automatically activating the most efficient R/T pair.

Figure 2:
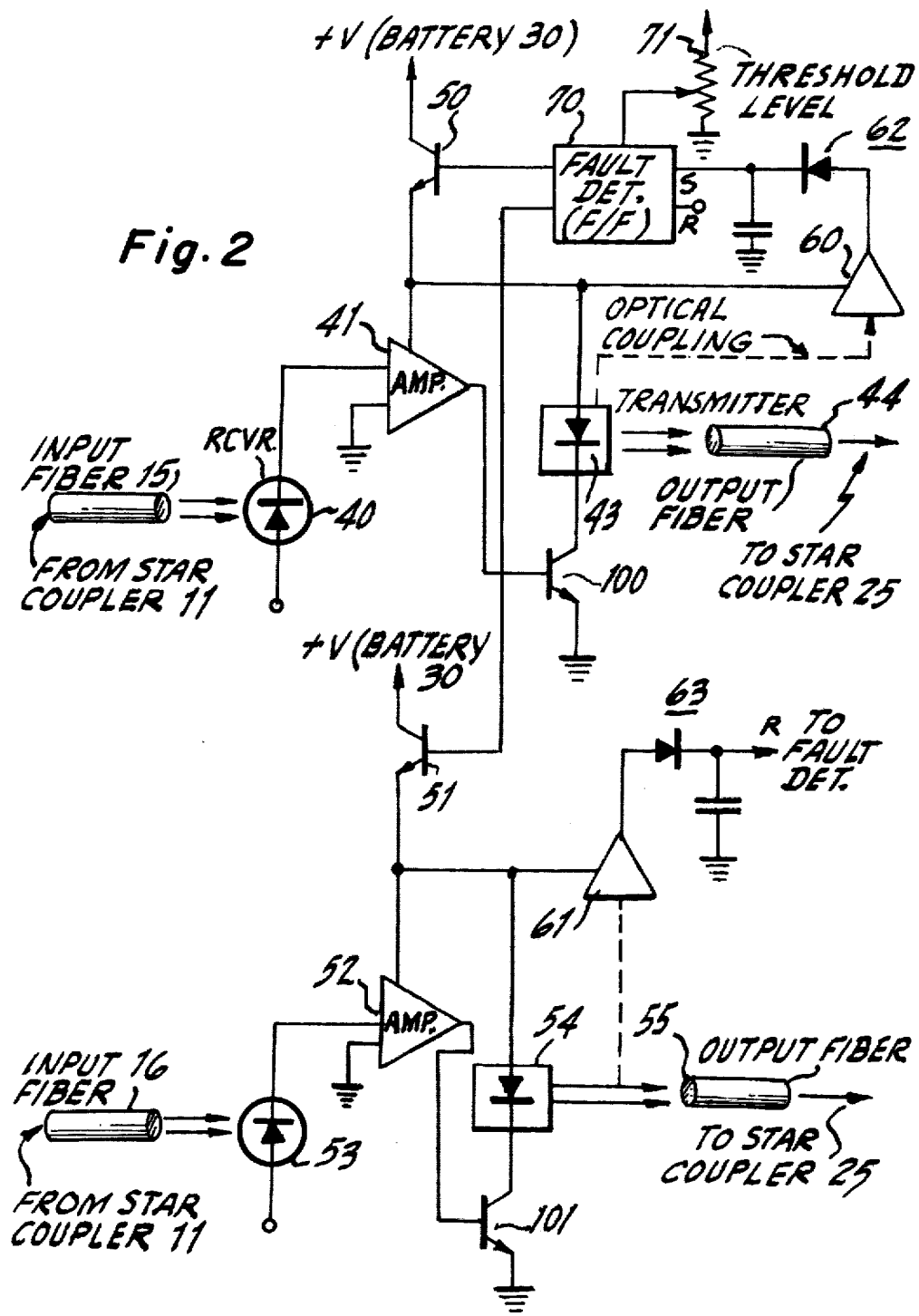
FIG. 2 is a schematic diagram of a switching technique employed in this invention.

Referring to FIG. 2, there is shown a simple schematic diagram of an optical transmission repeater as can be employed in conjunction with FIG. 1. Essentially, an output fiber from the optical star coupler 11 is directed as the input fiber 15 to a first photodiode 40. The photodiode 40 may be a p-i-n device as indicated and many such devices are available in the present state of the art. Some photodiodes are fabricated from silicon and exhibit peak response which match the peak emissions of light emitting diodes and the low loss spectral region of the optical fibers.

The diode is coupled to an amplifier device 41 which serves to produce an electrical signal indicative of the light intensity impinging upon the diode 40. The electrical signal from amplifier 41 is used to activate a laser diode 43. The laser diode 43 may be a heterojunction structure fabricated from gallium-arsenide or gallium-aluminum-arsenide. The diode 43 is modulated by the amplifier 41 to produce an increased intensity light signal at its output which directly follows the input light signal impinging on diode 40. The laser diode 43 is coupled to an output fiber 44 which in turn, is directed to the output star coupler for transmission to the next cable section.

The circuit described above is a typical receive-transmit circuit and it is, of course, understood that the same circuit could be used as a transmit-receive circuit by reversing the input and output fibers.

In any event, complete bias for the amplifier 41 and hence, the photodiode 40 and the laser diode 43 is derived from a first transistor 50. The collector electrode of transistor 50 is coupled to a source of potential such as that available via battery 30.

A second transistor 51 is shown. Transistor 51 also has its collector electrode connected to battery 30 and its emitter electrode connected to an amplifier 52 associated with another R/T pair such as 19 of FIG. 1. The amplifier 52 is also associated with a photodiode 53 for receiving light from fiber 16 and a laser diode 54 for providing an amplified signal to the output fiber 55 for coupling to the star coupler 25.

As shown in FIG. 2, the optical output from the laser diodes 43 and 54 is applied to an input of a respective amplifier as 60 and 61. The inputs to the amplifiers 60 and 61 may also be photodiodes or one could employ phototransistors and hence, each amplifier as 60 and 61 provides an output which is directly proportional to the signal obtained via the respective laser diodes 42 and 54.

The laser diodes 43 and 54 respond to current changes controlled by the series transistors 100 and 101. These transistors are activated and deactivated by the amplifiers 41 and 52 according to the signal information. The base electrodes of the amplifiers are connected to the output terminals of the amplifiers 41 and 52. The laser diodes receive biasing via transistors 50 and 51 which are connected to source 30.

The output of each amplifier is applied to diode detector circuits 62 and 63. The filter capacitor of each circuit is selected to provide an output proportional to the average value of the signal emanating from the laser diodes 43 and 64. Each amplifier 60 and 61 receives its bias from the emitter electrode of the switching transistors 50 and 51. The outputs of each detector 62 and 63 are applied to separate input terminals of a fault detector circuit 70.

Also shown coupled to the fault detector circuit 70 is a threshold level adjust 71. This is shown as a potentiometer but it is understood that a voltage divider or many other suitable fixed networks could be employed.

As indicated, the fault detector circuit 70 can comprise many conventional and known circuits. In essence, the fault detector operates to monitor the voltage level developed at the output of detectors 62 and 63 and to provide a signal when this level falls below a predetermined value indicative of a proper light output. The fault detector 70 includes a flip/flop or bistable multivibrator at its output, which device is triggered upon receipt of a signal below the threshold level. The base electrodes of transistors 50 and 51 are respectively coupled to a different output of the bistable multivibrator. In this manner, only one transistor as 50 or 51 can be activated at any one time and hence, only one receive-transmit circuit as 41 or 52 can be activated at one time. As soon as the fault detector provides a control signal, the bistable is operated to thus bias off one of the transistors as 50 and hence, remove bias from one R/T circuit and to operate transistor 51 and hence, to switch in or cause the next R/T circuit to work.

It is thus seen from the circuit in FIG. 2 that the switch between R/T pairs is automatically accomplished when the level of the detected optical signal falls below the threshold value. It is understood from the circuit shown in FIG. 2 that by employing suitable digital techniques such as a multiple stage counter which will advance a count for each control signal derived from the fault detector 70, one could control a plurality of R/T pairs in the manner shown in FIG. 2. It is therefore understood that the above described techniques will enable control of more than two R/T pairs.

It will also be apparent to those skilled in the art that the detectors such as 62 and 63 in conjunction with amplifiers 61 and 60 can be formulated to respond directly to digital data as contained in the optical signal and hence, one may use shift registers and decoders to detect a digital control signal which may be included in the optical data in order to enable monitoring of the optical transmission.

I claim:

1. An optical transmission system comprising:
    input coupling means for receiving an optical signal at an input terminal and for propagating said signal to a plurality of output terminals;
    a plurality of optical receiver-transmitter pairs, each having an input coupled to and associated with one of said output terminals, each of said receiver-transmitter pairs adapted to be selectively activated to respond to said optical signal upon selection;
    detector means coupled to said receiver-transmitter pairs and operative to monitor the optical signal propagating therein to provide a control signal when said signal exhibits a deviation from predetermined standards;
    switching means coupled to said plurality of optical receiver-transmitter pairs for sequentially selecting any desired one, said switching means responsive to said control signal to select only one receiver-transmitter pair as compared to another when said signal exhibits said deviation; and
    a fault location encoder having an input coupled to one output of said input coupling means for receiving said optical signal, and adapted to be selectively activated by said switching means when all signals from said receiver-transmitter pairs exhibit said deviation to provide at an output a signal indicative of total failure of said optical transmission system.

2. The optical transmission system according to claim 1 wherein said input cooling means comprises an optical star coupler.

3. The optical transmission system according to claim 1 wherein each of said plurality of optical receiver-transmitter pairs has an output terminal and optical coupling means coupling said output terminals together for providing an optical output signal for said transmission system from any one of said selected receiver-transmitter pairs.

4. The optical system according to claim 3 wherein said output optical coupling means is an optical star coupler.

5. The optical system according to claim 1 wherein said detector means is an average detector operative to provide a control signal corresponding to the average intensity of said optical signal.

6. The optical system according to claim 1 wherein said switching means comprises means for selectively biasing said any desired one of said optical receiver-transmitter pairs.

7. The optical transmission system according to claim 1 wherein said receiver-transmitter pairs each include a photodetector circuit responsive to said optical signal to provide an output signal according to the magnitude of said optical signal and light emitting means responsive to said output signal to provide an amplified optical signal according to said detected optical signal.

8. The optical transmission system according to claim 7 wherein said switching means operates to selectively bias said photodetector and said light emitting means when an associated receiver-transmitter pair is selected.

9. The optical transmission system according to claim 1 wherein said switching means operates to sequentially select said receiver-transmitter pairs according to said control signal from a first one to a last one.

10. The optical transmission system according to claim 1 including means for applying a potential coupled to said switching means whereby said switching means operates to supply said potential to said selected one of said receiver-transmitter pairs.

* * * * *